(12) United States Patent
Wenzler

(10) Patent No.: US 9,500,711 B2
(45) Date of Patent: Nov. 22, 2016

(54) METHOD AND DEVICE FOR DETERMINING A CHARGE STATE OF A BATTERY WITH THE AID OF A FLUXGATE SENSOR

(75) Inventor: Axel Wenzler, Rottweil (DE)

(73) Assignee: Robert Bosch GmbH, Stuttgart (DE)

( * ) Notice: Subject to any disclaimer, the term of this patent is extended or adjusted under 35 U.S.C. 154(b) by 952 days.

(21) Appl. No.: 13/387,032

(22) PCT Filed: Jun. 2, 2010

(86) PCT No.: PCT/EP2010/057711
§ 371 (c)(1),
(2), (4) Date: Apr. 6, 2012

(87) PCT Pub. No.: WO2011/012361
PCT Pub. Date: Feb. 3, 2011

(65) Prior Publication Data
US 2012/0191389 A1    Jul. 26, 2012

(30) Foreign Application Priority Data
Jul. 31, 2009  (DE) .................. 10 2009 028 167

(51) Int. Cl.
*G01R 19/20* (2006.01)
*G01R 31/36* (2006.01)
*G01R 15/18* (2006.01)

(52) U.S. Cl.
CPC ......... *G01R 31/3606* (2013.01); *G01R 15/185* (2013.01); *G01R 19/20* (2013.01)

(58) Field of Classification Search
CPC ................ G01R 31/3606; G01R 15/185; F02P 3/0456; F02P 15/08; F02P 17/12;
(Continued)

(56) References Cited

U.S. PATENT DOCUMENTS 4,347,469 A * 8/1982 Dinger ........................ 318/533
5,642,031 A * 6/1997 Brotto .................. H02J 7/0081
                                                        320/156
(Continued)

FOREIGN PATENT DOCUMENTS

DE    28 34 499    8/1979
DE    30 30 225    3/1981
(Continued)

OTHER PUBLICATIONS

DE4229948 A1—English Translation, Mar. 1994, Knuth pp. 1-9.*
(Continued)

*Primary Examiner* — Toan Le
*Assistant Examiner* — Jeffrey Aiello
(74) *Attorney, Agent, or Firm* — Norton Rose Fulbright US LLP; Gerard Messina

(57) ABSTRACT

A method for determining the charge state of a battery in a motor vehicle includes steps of applying a measuring voltage to a coil, cyclically reversing the polarity of the measuring voltage if the absolute value of the secondary current flowing through the coil exceeds a predetermined threshold value, scanning the secondary current, reconstructing the curve of the secondary current based on the scanned secondary current values, and determining the charge state based on the curve of the secondary current values.

15 Claims, 4 Drawing Sheets

(58) Field of Classification Search
CPC ............... H02M 3/33507; B60L 1/00; B60L 2200/00; Y02T 10/7005
USPC .......... 702/63; 320/108, 130, 119; 123/644; 324/388
See application file for complete search history.

(56) References Cited

U.S. PATENT DOCUMENTS

| | | | |
|---|---|---|---|
| 2003/0121509 A1* | 7/2003 | Schmied | F02P 3/0552 123/651 |
| 2006/0158176 A1* | 7/2006 | Preusse et al. | 324/117 R |
| 2008/0012041 A1* | 1/2008 | Kesler | F02P 3/053 257/139 |
| 2009/0195252 A1* | 8/2009 | Kerbel | 324/426 |
| 2012/0191389 A1* | 7/2012 | Wenzler | G01R 31/3606 702/63 |
| 2013/0154652 A1* | 6/2013 | Rice et al. | 324/426 |

FOREIGN PATENT DOCUMENTS

| | | | | |
|---|---|---|---|---|
| DE | 36 11 683 | 10/1987 | | |
| DE | 42 29 948 | 3/1994 | | |
| DE | 4229948 A1 * | 3/1994 | ............. | G01R 19/18 |
| DE | 198 02 831 | 8/1998 | | |
| DE | 10 2005 060 874 | 6/2007 | | |
| DE | 10 2008 029 477 | 12/2009 | | |
| EP | 0 560 468 | 9/1993 | | |

OTHER PUBLICATIONS

International Search Report of PCT/EP2010/057711, dated Sep. 3, 2010.
Selinger, J. F. et al.: "Robust Reconstruction of Nonuniformly Sampled Signals," Circuit Theory and Design, 2005. Proceedings of the 2005 European Conference on Cork, Ireland Aug. 29-Sep. 1, Piscataway, NJ, vol. 1, Aug. 29, 2005, pp. 135-138, XP010845242.

* cited by examiner

METHOD AND DEVICE FOR DETERMINING A CHARGE STATE OF A BATTERY WITH THE AID OF A FLUXGATE SENSOR

BACKGROUND OF THE INVENTION

1. Field of the Invention

The present invention relates to a method for determining a charge state of a battery in a motor vehicle with the aid of a fluxgate magnetometer.

2. Description of Related Art

Modern motor vehicles have a plurality of subsystems that are dependent on a supply of electrical current. Several such subsystems, for example, an electronic immobilizer or an alarm system, may consume current even if a drive engine of the motor vehicle is not in operation, and the required current is provided by an electrical system battery. Frequently, the above-named subsystems become active only at certain intervals, and spend the remaining time in a power-saving mode. In order to ensure a charge state of the battery which is sufficient for starting the drive engine with the aid of an electric starter motor after a longer period of shutdown of the motor vehicle, the subsystems are controlled as a function of the charge state of the battery. Various methods are known for determining the charge state. Usually they require a determination of the flow of the battery current into the battery and from the battery. From the current flow it is possible to infer whether the battery is being charged or discharged, from which the charge state of the battery may be ascertained.

To avoid galvanic coupling in the case of a current determination of the battery current, a fluxgate magnetometer is used to determine a magnetic field that is induced by the battery current in a conductive element connected to the battery. The battery current is then determined from the magnetic field. For magnetic field measurement, a soft magnetic coil core that is exposed to the magnetic field of the conductive element is driven cyclically into magnetic saturation with the aid of a secondary coil. During certain periods of such a measuring cycle, the current flowing through the coil corresponds to the battery current divided by the transmission ratio.

Published German patent application document DE 42 29 948 A1 shows such a current sensor based on a fluxgate magnetometer. The time periods of each measuring cycle in which the coil core has reached magnetic saturation cannot be used for a determination of the magnetic field or the battery current, so that the fluxgate magnetometer is "blind" during these time periods. In particular in the case of electrical consumers having a periodically varying power consumption, these "blind" time periods may result in incorrect determinations of the battery current.

BRIEF SUMMARY OF THE INVENTION

An object of the present invention is therefore to provide a method for making a determination of a charge state of a battery in a motor vehicle more precise and reliable with the aid of a fluxgate magnetometer.

A measuring voltage is applied to a coil that is magnetically coupled to a battery current-carrying conductive element with the aid of a soft magnetic coil core until a secondary current flowing through the coil reaches a predetermined threshold value, which indicates the achievement of magnetic saturation of the coil core, after which the polarity of the measuring voltage is reversed. If the secondary current reaches the threshold value again, the polarity of the measuring voltage is reversed again and a measuring cycle is run through completely. During the measuring cycle, the secondary current is scanned and the curve of the secondary current is reconstructed from the scannings. The battery charge state is then determined based on the curve of the secondary current values.

Reconstructing the flow of the secondary current makes it also possible to detect fluctuations in the battery current, which occur at points in time at which it is not possible to perform a direct measurement with the aid of the described structure of a fluxgate magnetometer. In particular, when determining the flow of the battery current across a plurality of measuring cycles, the indicated method makes it possible to avoid a determination of current fluctuations of the battery current having so-called alias frequencies (also: beat frequencies), which may occur when a periodically fluctuating battery current is scanned periodically and the two periods do not match.

It is possible to scan the secondary current more than twice per cycle, for example, in each half cycle at least twice or more often. The step of reconstructing makes it possible for each single measurement to improve the accuracy of the determination of the magnetic field, so that there is practically no upper limit to the number of scannings per cycle. For an increase in the number of scannings per unit of time, a cycle time may thus remain constant, making it possible to omit an adjustment of the measuring system.

The scannings may be performed at different time intervals. A suitably carried out reconstruction makes it possible to process values that have not been scanned equidistantly in this manner, so that scannings are preferably made in the periods of the cycle in which the information gain is maximized by the scanning. This is, for example, the case in the periods of time in which the soft magnetic coil core is not magnetically saturated.

It is only possible to perform the reconstruction based on scannings that were ascertained outside a predetermined time range around the points in time of reversing the polarity of the measuring voltage. The polarity of the measuring voltage is reversed when the soft magnetic coil core is magnetically saturated. In a certain time range around this point in time, the value of the secondary current does not provide usable information concerning the magnetic field to be determined or the magnetic field-inducing battery current. It is therefore possible to omit scannings in this range for lack of information gain, or scannings made in this range may be discarded, so that the step of reconstructing the curve of the secondary current is only based on scannings that indicate the battery current.

The described method in particular makes it possible to detect periodic battery current fluctuations, which are caused by the motor vehicle's subsystems, which are periodically activated.

Points in time of scanning may be determined based on a cycle duration over time of a preceding cycle. Depending on a number of parameters, such as an absolute value of the battery current or a prevailing temperature, the duration of a measuring cycle may vary, measuring cycles following one after the other over time usually having only a slight deviation in their cycle durations. The length of a measuring cycle normally ranges from 2 ms to 5 ms.

The charge state may also be determined based on the battery voltage, it being possible to scan the battery voltage simultaneously with the secondary current and to determine the curve of the battery voltage based on the scanned battery voltage values in an appropriate manner. This makes it possible to ensure that the reconstructed curve of the battery voltage and the reconstructed flow of the battery current are synchronized with one another, so that no determination errors result from different references over time. In an alternative specific embodiment, scanned battery voltage values may also be delayed in time with the aid of a timing element in such a way that they may be assigned to the appropriate secondary current values after the secondary current flow is reconstructed. Such a delay may occur for a statically predetermined period of time or dynamically for the particular period of time required for the complete reconstruction.

The aforementioned method may be implemented as a user-specific IC (ASIC). The coil, the coil core and the described device may be integrated into a separate module.

It is possible to control the scannings over time with the aid of a sequence control. In particular, the points in time of the scannings may be determined by the sequence control based on a cycle duration over time of a preceding cycle.

DETAILED DESCRIPTION OF THE INVENTION

Figure 1:
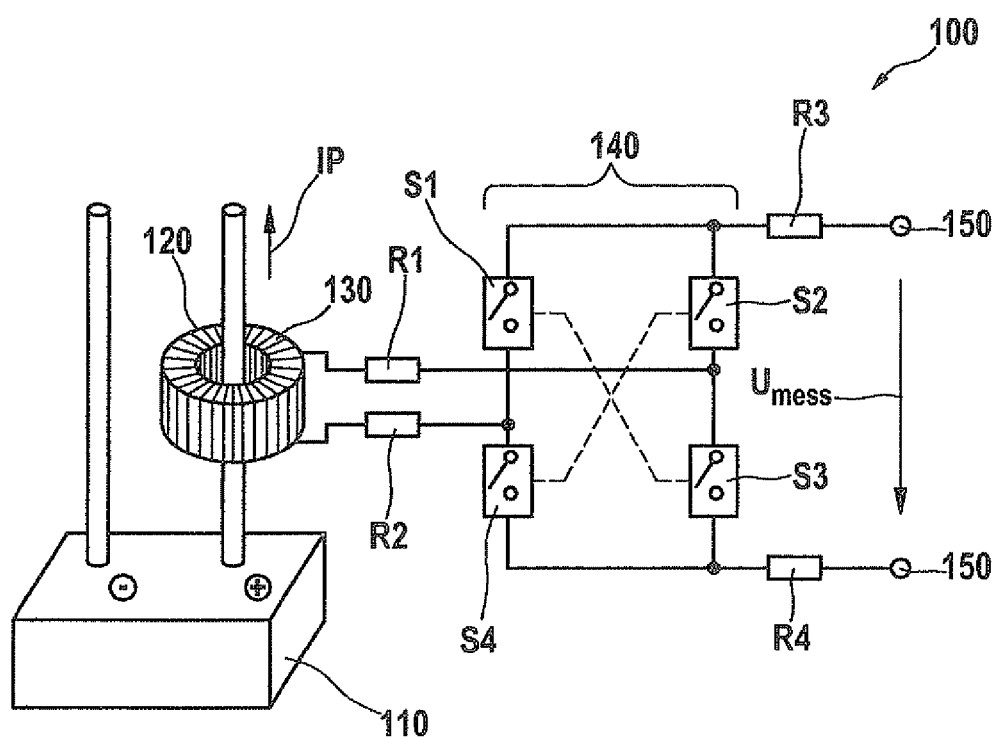
FIG. 1 shows a measuring system for determining a battery current according to the principle of magnetic compensation.

FIG. 1 shows a measuring system 100 for determining a battery current (primary current) IP of a battery 110. A coil 120 is wound around a toroidal coil core 130, through which a conductive element is guided to battery 110. Not shown consumers are connected to battery 110 above the diagram. Two terminals of coil 120 lead to an H-circuit 140. This H-circuit includes four switches S1 through S4, which are synchronized with one another in such a way that either only S1 and S3 or only S2 and S4 are closed, so that a measuring voltage $U_{mess}$ of a measuring voltage source 150 is applied to coil 120 in normal or reverse polarity. At each of measuring resistors (shunts) R1 through R4, a voltage drops off which is characteristic of secondary current IS flowing through coil 120. In practice only one of resistors R1 through R4 is designed as a shunt; the others are substituted by conductive elements.

Figure 2:
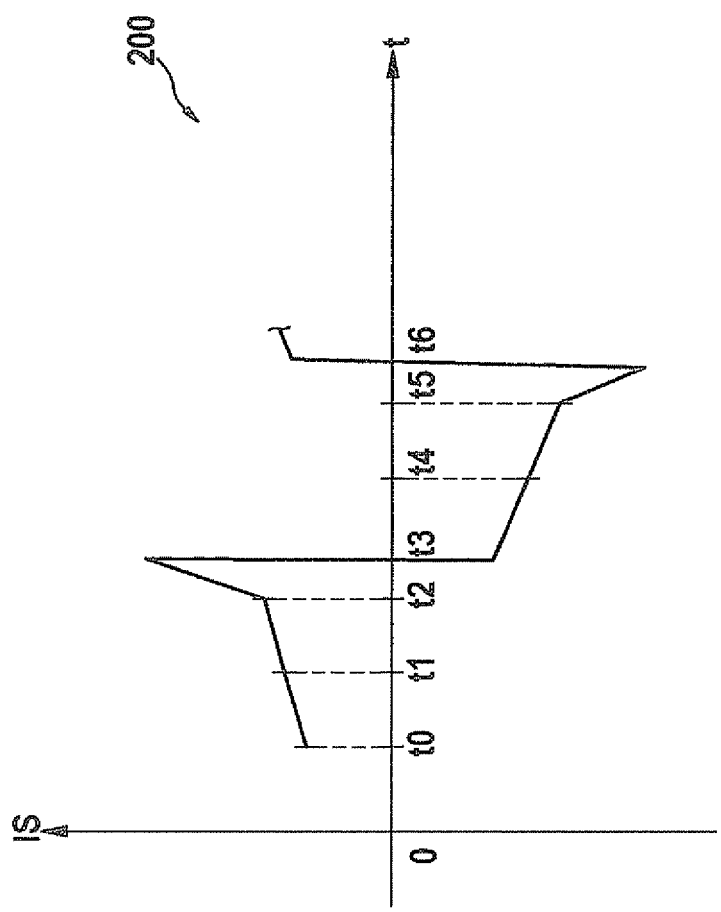
FIG. 2 shows a shape of the curve over time of the secondary current in the fluxgate magnetometer from FIG. 1.

The principle of a measurement with the aid of measuring system 100 will now be explained with reference to FIG. 2 which illustrates a shape of the curve over time 200 of secondary current IS of coil 120 from FIG. 1. Secondary current IS is plotted in the vertical direction and a time t is plotted in the horizontal direction in FIG. 2. Shown curve 200 corresponds to one measuring cycle, after which the process repeats itself.

Around coil core 130, a transmitter is built up, the primary winding of which is made up of the conductive element connected to battery 110 (primary winding number: 1) and its secondary winding is made up of coil 120 (secondary winding number: usually 500-1000). The transmitter has a transmission ratio corresponding to the ratio of the winding numbers, for example, 1:500 to 1:1000. Battery current IP generates a magnetic field in the area of soft magnetic core coil 130 in the conductive element connected to battery 110. Secondary current IS through coil 120 will now be set in such a way that the magnetic field generated with the aid of coil 120 compensates exactly for the magnetic field generated by the primary current. Secondary current IS multiplied by the transmission ratio then corresponds to battery current IP.

After applying measuring voltage $U_{mess}$ to coil 120 at point in time t0, coil 120 behaves like a high inductance while it builds up a magnetic field, and secondary current IS flowing through it rises slowly. At point in time t2, the built up magnetic field is so great that coil core 130 is magnetically saturated, and coil 120 behaves like a low inductance, which means that secondary current IS rises more rapidly. At point in time t3, secondary current IS reaches a predetermined threshold, and H-circuit 140 is activated for reversing the polarity of the measuring voltage applied to coil 120.

Coil 120 then behaves again like a low inductance, and secondary current IS rises slowly again with a changed sign until core coil 130 is fully magnetized in the opposite direction at point in time t5 and becomes magnetically saturated. Coil 120 then behaves again like a low inductance and secondary current IS flowing through it increases in absolute value more rapidly. At point in time t6, the absolute value of secondary current IS has again reached the threshold value, and H-circuit 140 is activated for again reversing the polarity of measuring voltage $U_{mess}$ at coil 120.

Secondary current IS, which results in the sought compensation of magnetic fields in coil core 130, is in each case to be found in the center of those areas of curve 200 of secondary current IS in which coil 120 behaves like a high inductance, i.e., at points in time t1 and t4. A difference in absolute value between secondary current values IS between points in time t1 and t4 is caused by a hysteresis of coil 120 wound around coil core 130. The mean value between the two secondary current values IS, multiplied by the transmission ratio, thus corresponds to battery current IP.

Scannings of secondary current IS, which occur in the time periods t0-t2 and t3-t5, may be used to improve the determination of secondary current IS at points in time t1 and t4 due to the linearity of curve 200 in these areas. In time periods t2-t3 and t5-t6, in which coil body 130 is magnetically saturated, it is not possible to perform meaningful scannings of secondary current IS for the magnetic field to be determined.

The measuring cycle from t0 to t6, for example, may be scanned twelve times at the following points in time:

[0.15; 0.20; 0.25; 0.30; 0.35; 0.40; 0.65; 0.70; 0.75; 0.80; 0.85; 0.90]*Tcycle;

Tcycle being the period of time between t0 and t6 which may be determined approximately based on a cycle duration over time of a preceding cycle. Points in time [0.05; 0.10; 0.45; 0.50; 0.55; 0,60; 0,95], which are lacking for an equidistant scanning of curve 200, are located in the areas of magnetic saturation t2-t3 and t5-t6, so that a scanning is omitted.

The non-equidistant values of secondary current IS scanned in this manner may be transformed initially as part of a subsequent processing in such a way that they have the same sign as battery current IP. The scanned values may then be compensated for the hysteresis of coil 120 wound around coil core 130 and for the linear deviations in first measuring section t0-t2 and in second measuring section t3-t5. A series of non-equidistantly scanned secondary current values IS, which indicate different points in time of measurement on a battery current IP, is then available as an interim result. In order to also detect changes in battery current IP, which are in the ranges t2-t3 and t5-t6, the scanned values now present are subjected to a signal reconstruction, which reconstructs the periodic signals between the points in time of scanning. This makes it possible to provide a curve of secondary current IS, which also follows actual battery current IP across "blind" periods t2-t3 and t5-t6 very well. From this curve it is possible to infer a charge state of battery 110 with high reliability.

The reconstruction may depict periodic portions of the curve of the secondary current below a predetermined maximum frequency. For example, the method for real-time reconstruction of a non-equidistantly scanned analog signal described in published German patent application document DE 10 2005 060 874 A1 may be used for the reconstruction. In this method, a number of filters are provided, each reconstructing a periodic part of the original signal. The reconstructed maximum frequency of the signal depends on the type or number of filters and the number of scannings per measuring cycle.

Figure 3:
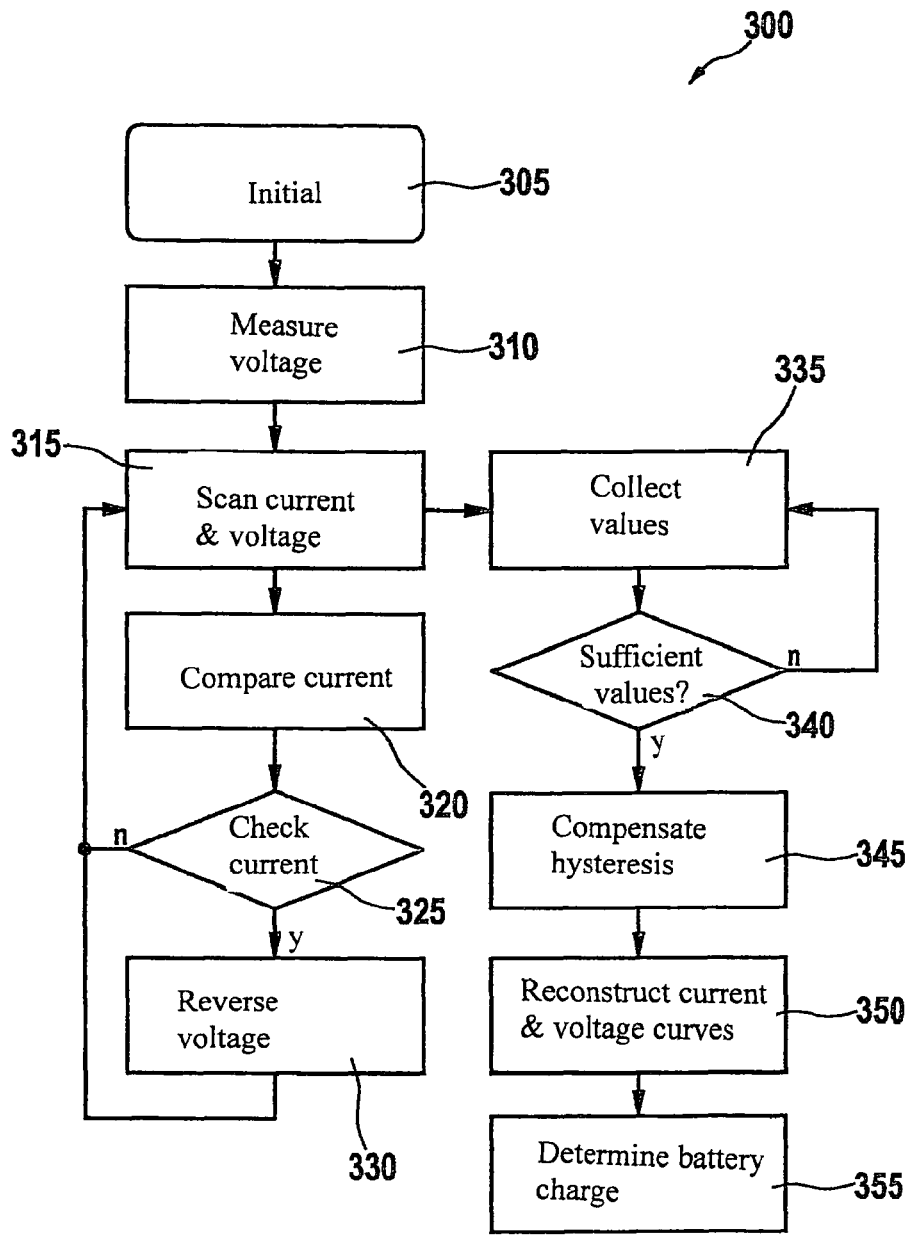
FIG. 3 shows a schematic diagram of a device for determining the charge state of a battery with the aid of the fluxgate magnetometer from FIG. 1.

FIG. 3 shows a method 300 for determining a charge state of a battery with the aid of measuring system 100 from FIG. 1. In a step 305, the method is in the initial state. In a step 310, measuring voltage $U_{mess}$ is applied to coil 120. Subsequently, in a step 315, secondary current IS and the battery voltage of battery 110 are scanned. Points in time for these scannings may be determined based on a cycle duration of a preceding measuring cycle, for example, as predetermined relative points in time (5%, 10%, . . . of the cycle duration). The scanned secondary current is evaluated in two ways. On the one hand, in a step 320, secondary current IS is compared with a threshold value, and in a step 325, it is checked if the secondary current has exceeded the threshold value. If this is the case, the polarity of the measuring voltage is reversed in a step 330. From steps 325 or 330, the method returns to step 315 and is repeated.

On the other hand, the values of secondary current IS scanned in step 315 are collected in a step 335. In a step 340, it is then determined if sufficient scanned values are present. This is normally the case if scanned values of a complete measuring cycle are present. If this is not the case, the method returns to step 335 and collects additional scanned values. If sufficient values are collected in step 340, the collected values of secondary current IS are preprocessed in a following step 345 by making their signs identical in order to compensate for the hysteresis of the transmitter and with regard to the linear curve in the ranges t0-t2 and t3-t5. A preprocessing of the directly measurable battery voltage may be omitted. In a step 350, curves of secondary current IS and the battery voltage are then reconstructed from the scanned values. Finally, the charge state of battery 110 is determined in a step 355 based on the reconstructed curves.

Figure 4:
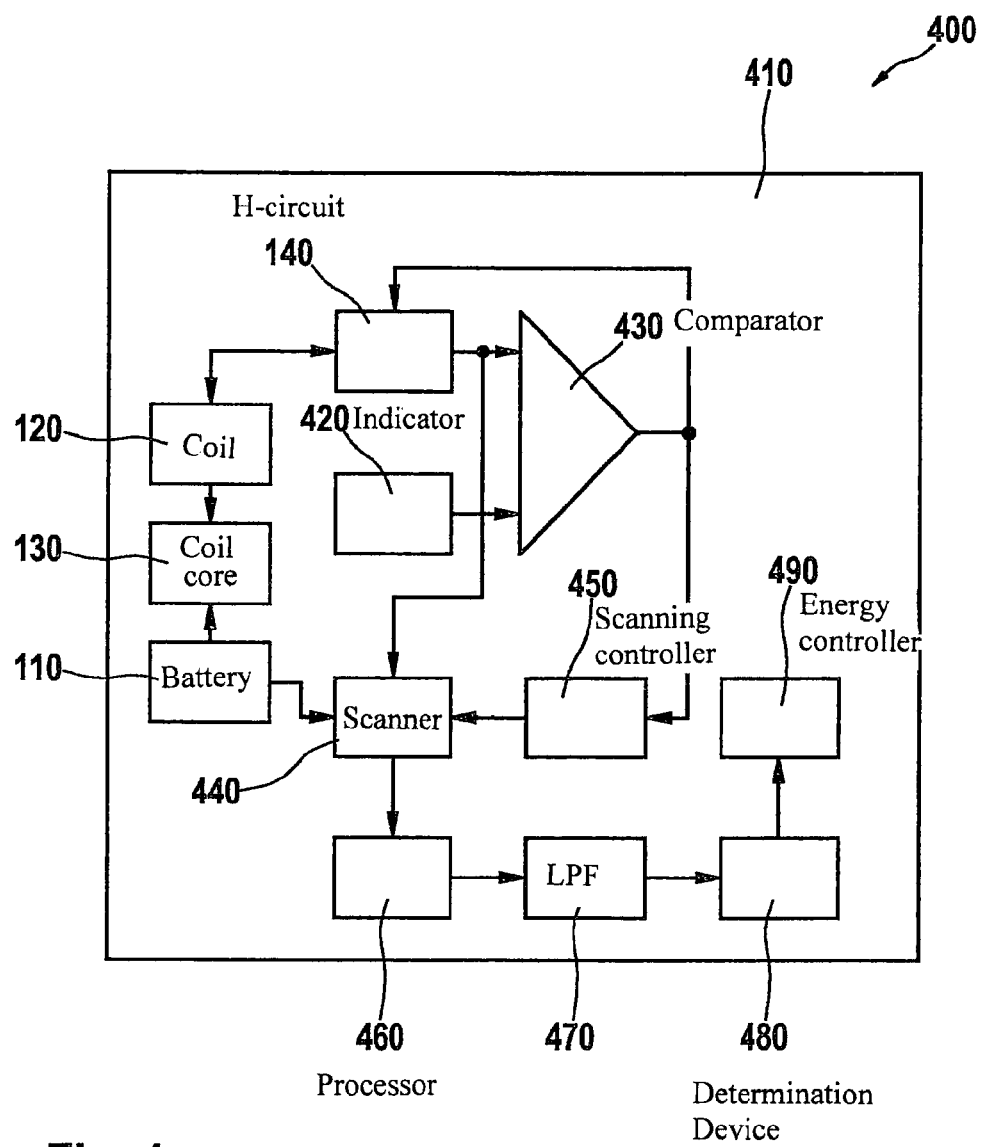
FIG. 4 shows a flow chart of a method for determining the charge state of a battery from FIG. 1.

FIG. 4 shows a schematic diagram 400 of a device for determining the charge state of a battery with the aid of measuring system 100 from FIG. 1. The device located on board a motor vehicle 410 includes battery 110, coil 120, coil core 130 and H-circuit 140 from FIG. 1. Elements 110 to 140 are connected to one another corresponding to measuring system 100 in FIG. 1. Furthermore, the device includes a threshold value indicator 420, a comparator 430, a scanner 440, a scanning controller 450, a processing device 460, a low pass 470, a determination device 480, and an energy controller 490. Comparator 430 is connected to H-circuit 140 and threshold value indicator 420 and determines whether a secondary current IS provided by H-circuit 140 exceeds the threshold value or not. It makes a corresponding signal available to scanning controller 450 and H-circuit 140, after which H-circuit 140 reverses the polarity of measuring voltage $U_{mess}$ at coil 120 as a function of the signal. Scanner 440 is connected to one of measuring resistors R1 through R4 at H-circuit 140 and receives a signal from it that indicates secondary current IS. Furthermore, scanner 440 is connected to battery 110 and receives a signal from it that indicates the battery voltage. Moreover, scanner 440 is connected to scanning controller 450 to perform scannings as described above at predetermined points in time.

Finally, scanner 440 is also connected to processing device 460 and provides it the scanned values of secondary current IS and the battery voltage. Processing device 460 is designed for processing the scanned values described above with reference to FIGS. 2 and 3, in particular the reconstruction of the curve of secondary current IS. Processing device 460 is connected to low pass 470 and provides it with the reconstructed curves. Low pass 470 is connected to determination device 480 and provides it with smoothed curves. Via a connection with energy controller 490, determination device 480 makes available a charge state of battery 110 determined by it. Energy controller 490 is designed for influencing the energy behavior of individual consumers on board motor vehicle 410 as a function of the determined charge state of battery 110, for example, by changing an activity or rest interval or by deactivating.

What is claimed is:

1. A method for determining a charge state of a battery in a motor vehicle, comprising:
    applying a measuring voltage to a coil, which is a secondary coil, wherein the coil surrounds a conductive element which is connected to the battery;
    cyclically reversing the polarity of the measuring voltage when the absolute value of a secondary current flowing through the secondary coil exceeds a predetermined threshold value;
    scanning values of the secondary current;
    reconstructing a curve of the secondary current based on the scanned secondary current values so as to provide a secondary current curve; and
    determining the charge state of the battery based at least on the curve of the secondary current values;
    wherein points in time for the scannings are determined based on a cycle duration of a preceding measuring cycle as predetermined relative points in time,
    wherein the scannings of the secondary current, which occur in select time periods, are used to improve a determination of secondary current at points in time, and
    wherein the secondary current, which results in a sought compensation of magnetic fields in the coil, is found in the center of areas of a curve of the secondary current in which the coil behaves with a high inductance characteristic, and wherein the scannings of the secondary current, which occur in certain time periods are used to improve the determination of the secondary current at points in times during the time periods due to a linearity of the curve in these time periods.

2. The method as recited in claim 1, wherein the secondary current is scanned more than 2 times per measuring cycle, wherein for magnetic field measurement, a soft magnetic coil core is exposed to a magnetic field of the conductive element is driven cyclically, which is the measuring cycle, into magnetic saturation with the secondary coil.

3. The method as recited in claim 2, wherein the scannings of the secondary current values are performed at different time intervals.

4. The method as recited in claim 3, wherein the reconstruction of the curve is only based on scanned values from outside a predetermined time range surrounding the points in time of reversing the polarity of the measuring voltage.

5. The method as recited in claim 2, wherein the reconstruction depicts periodic portions of the secondary current curve below a predetermined maximum frequency.

6. The method as recited in claim 2, further comprising: determining points in time of scanning values of the secondary current based on a cycle duration of a preceding measuring cycle.

7. The method as recited in claim 2, wherein the charge state of the battery is additionally determined based on the battery voltage, and wherein the method further comprises:
scanning the battery voltage simultaneously with the secondary current; and
reconstructing a curve of the battery voltage based on the scanned battery voltage values.

8. A device for determining a charge state of a battery in a motor vehicle, comprising:
a measuring voltage source applying a measuring voltage to a coil, which is a secondary coil, wherein the coil surrounds a conductive element which is connected to the battery;
a comparator comparing the absolute value of a secondary current flowing through the secondary coil with a predetermined threshold value;
a reversing device cyclically reversing the polarity of the measuring voltage as a function of the comparison result;
a scanning device scanning the secondary current values;
a processing device reconstructing a curve of the secondary current based on the scanned secondary current values; and
a determination device determining the charge state of the battery based on the curve of the secondary current values;
wherein points in time for the scannings are determined based on a cycle duration of a preceding measuring cycle as predetermined relative points in time,
wherein the scannings of the secondary current, which occur in select time periods, are used to improve a determination of secondary current at points in time, and
wherein the secondary current, which results in a sought compensation of magnetic fields in the coil, is found in the center of areas of a curve of the secondary current in which the coil behaves with a high inductance characteristic, and wherein the scannings of the secondary current, which occur in certain time periods are used to improve the determination of the secondary current at points in times during the time periods due to a linearity of the curve in these time periods.

9. The device as recited in claim 8, further comprising:
a scanning controller controlling the scanning of the secondary current values over time.

10. The device as recited in claim 8, wherein the secondary current is scanned more than 2 times per measuring cycle, wherein for magnetic field measurement, a soft magnetic coil core is exposed to a magnetic field of the conductive element is driven cyclically, which is the measuring cycle, into magnetic saturation with the secondary coil.

11. The device as recited in claim 10, wherein the scannings of the secondary current values are performed at different time intervals.

12. The device as recited in claim 11, wherein the reconstruction of the curve is only based on scanned values from outside a predetermined time range surrounding the points in time of reversing the polarity of the measuring voltage.

13. The device as recited in claim 10, wherein the reconstruction depicts periodic portions of the secondary current curve below a predetermined maximum frequency.

14. The device as recited in claim 10, wherein points in time of scanning values of the secondary current are determined based on a cycle duration of a preceding measuring cycle.

15. The device as recited in claim 10, wherein the charge state of the battery is additionally determined based on the battery voltage, wherein the battery voltage is scanned simultaneously with the secondary current, and wherein a curve of the battery voltage is reconstructed based on the scanned battery voltage values.

* * * * *